(12) United States Patent
Blodget

(10) Patent No.: US 6,510,546 B1
(45) Date of Patent: Jan. 21, 2003

(54) METHOD AND APPARATUS FOR PRE-ROUTING DYNAMIC RUN-TIME RECONFIGURABLE LOGIC CORES

(75) Inventor: Brandon J. Blodget, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 204 days.

(21) Appl. No.: 09/617,298

(22) Filed: Jul. 13, 2000

(51) Int. Cl.[7] .................................................. G06F 17/50
(52) U.S. Cl. ................................. 716/16; 716/2; 716/9; 716/17
(58) Field of Search ........................................ 716/1–21

(56) References Cited

U.S. PATENT DOCUMENTS

| | | | |
|---|---|---|---|
| 5,109,353 A | | 4/1992 | Sample et al. |
| 5,469,203 A | | 11/1995 | Kean |
| 5,499,192 A | | 3/1996 | Knapp et al. |
| 5,684,980 A | | 11/1997 | Casselman |
| 5,764,954 A | * | 6/1998 | Fuller et al. .................. 716/16 |
| 5,794,033 A | | 8/1998 | Aldebert et al. |
| 5,802,290 A | | 9/1998 | Casselman |
| 6,058,254 A | * | 5/2000 | Scepanovic et al. ........... 716/2 |
| 6,068,662 A | * | 5/2000 | Scepanovic et al. ........... 716/2 |
| 6,074,428 A | * | 6/2000 | Petler ............................ 716/2 |
| 6,075,933 A | * | 6/2000 | Pavisic et al. ................. 716/9 |
| 6,078,736 A | * | 6/2000 | Guccione ...................... 716/16 |
| 6,216,259 B1 | * | 4/2001 | Guccione et al. ............. 716/17 |

FOREIGN PATENT DOCUMENTS

| | | |
|---|---|---|
| EP | 0645723 | 3/1995 |
| GB | 2306728 A | 5/1997 |
| WO | WO 94/10627 | 5/1994 |

OTHER PUBLICATIONS

Eric Lechner and Steven A. Guccione: "The Java Environment for Reconfigurable Computing", Proceedings, Field-Programmable Logic and Applications, 7th International Workshop, FPL '97, London, UK, Sep. 1–3, 1997, pp. 284–293.

Xilinx, Inc., "The Programmable Logic Data Book," Sep. 1996, available from Xilinx, Inc., 2100 Logic Drive, San Jose, CA 95124, pp. 4–251 to 4–286.

Iseli et al., "A C ++ compiler for FPGA custom execution units synthesis," IEEE Symp. FPGAs for Custom Computing Machines, pp. 173–179, Apr. 1995.

Peterson et al., "Scheduling and partitioning ANSI–C programs onto multi–FPGA CCM architectures," pp. 178–187, Apr. 1996.

Guccione, "A data–parallel programming model for reconfigurable architectures," pp79–87, Apr. 1993.

Xilinx, Inc., "The Programmable Logic Data Book," 1998, available from Xilinx, Inc., 2100 Logic Drive, San Jose, CA 95124.

(List continued on next page.)

*Primary Examiner*—Vuthe Siek
*Assistant Examiner*—Andrea Liu
(74) *Attorney, Agent, or Firm*—LeRoy D. Maunu; Edel M. Young

(57) ABSTRACT

A method and apparatus for developing run-time parameterizable logic cores for programmable logic devices (PLDs). In various embodiments, logic cores are defined in a run-time reconfiguration program, the logic cores having output pins and input pins. A pre-route tool routes selected ones of the output pins to selected ones of the input pins and generates program code for the run-time reconfiguration program. The program code generated by the pre-route tool programs interconnect resources that make the required connections. The automatically generated program code is then parameterized and included in the run-time reconfiguration program.

17 Claims, 5 Drawing Sheets

OTHER PUBLICATIONS

Patrice Bertin et al, "PAM Programming Environments: Practice and Experience", Digital Equipment Corporation, Paris Research Laboratory, 85, avenue Victor Hugo, 92500 Rueil–Malmaison, France, IEEE Workshop on FPGAs for Custom Computing Machines, Apr. 10–13, 1994, Napa Valley, CA, pp. 133–138.

Alan Wenban and Geoffrey Brown, "A Software Development System for FPGA–Based Data Acquisition Systems", School of Electrical Engineering Cornell University, Ithaca, N.Y. 14853, IEEE Symposium on FPGAs for Custom Computing Machines, Apr. 17–19, 1996, Napa Valley, CA, pp. 28–37.

David A. Clark and Brad L. Hutchings, "Supporting PFGA Microprocessors through Retargetable Software Tools", Dept. of Electrical and Computer Engineering, Brigham Young, Univ., Provo, UT 84602, IEEE Symposium on PFGAs for Custom Computing Machines, Apr. 17–19, 1996, Napa Valley, CA, pp. 195–203.

Jeffrey M. Arnold, "The Splash 2 Software Environment", IDA Supercomputing Research Center, 17100 Science Dr., Bowie, MD 20715, IEEE Workshop on FPGAs for Custom Computing Machines, Apr. 5–7, 1993, Napa Valley, CA, pp. 88–93.

H. Hogl, A. Kugel, J. Ludvig, R. Manner, K. Noffz, R. Zoz, "Enable ++: A Second Generation FPGA Processor", Lehrstuhl fur Informatik V, Universitat Mannheim, IEEE Symposium on FPGAs for Custom Computing Machines, Apr. 19–21, 1995, Napa Valley, CA, pp. 45–53.

Beat Heeb, Cuno Pfister, "Chameleon: A Workstation of a Different Colour", Institut fur Computersysteme, ETH Zurich, CH–8092 Zurich, Switzerland, Second International Workshop on Field–Programmable Logic and Applications, Vienna, Austria, Aug./Sep. 1992. pp. 152–161.

"Automated Layout of Integrated Circuits", pp. 113–195 of "Design Systems for VLSI Circuits", edited by G. De Micheli, A. Sangiovanni–Vincentelli, and P. Antognetti, published 1987, by Martinus Nijhoff Publishers.

Nisbet and Guccione, "The XC6200DS Development System," Proceedings of the 7th International Workshop, on Field–Programmable Logic and Applications FPL '97, edited by W. Luk, P. Cheung, and M. Glesner, and published by Springer–Verlag, pp. 61–68.

"X–BLOX User Guide", published Apr., 1994, pp. 1–1 to 2–14 and 4–36 to 4–46, available from Xilinx, Inc., 2100 Logic Drive, San Jose, CA 95124.

"CORE Solutions Data Book", copyright 1997, pp. 4–3 to 4–4 and 2–3 to 2–91, available from Xilinx, Inc., 2100 Logic Drive, San Jose, CA 95124.

The University of Birmingham, "Dee–Introduction" with figure "Virtual Derik".

Virtual Computer Corporation Press Release, High Performance Results with New Hardware Software Co–Design System, dated Jan. 21, 1997 downloaded from Internet.

Virtual Computer Corporation Internet item, "H.O.T. Works—The Complete PCI–XC6200 Development System".

* cited by examiner

METHOD AND APPARATUS FOR PRE-ROUTING DYNAMIC RUN-TIME RECONFIGURABLE LOGIC CORES

RELATED PATENT APPLICATIONS

This patent application is related to the following co-pending patents/applications:

1. U.S. patent/application Ser. No. 08/919,531, entitled, "METHOD OF DESIGNING FPGAS FOR DYNAMICALLY RECONFIGURABLE COMPUTING," filed on Aug. 28, 1997 by Steven A. Guccione;
2. U.S. patent/application Ser. No. 09/168,300 entitled "CONFIGURATION OF PROGRAMMABLE LOGIC DEVICES WITH ROUTING CORES", filed Oct. 7, 1998 by Steven A. Guccione and Delon Levi; and
3. U.S. patent/application Ser. No. 09/501,356 entitled "RUN-TIME ROUTING FOR PROGRAMMABLE LOGIC DEVICES" filed Feb. 9, 2000 by Eric R. Keller, Steven A. Guccione and Delon Levi.

The above applications/patents are all assigned to the assignee of the present invention and the contents thereof are incorporated herein by reference.

GOVERNMENT CONTRACT

The U.S. Government has a paid-up license in the above-referenced invention and the right in limited circumstances to require the patent owner to license others on reasonable terms as provided for by the terms of DABT63-99-3-0004 awarded by DARPA.

FIELD OF THE INVENTION

The present invention generally relates to configuration of programmable logic devices, and more particularly to design-time routing of run-time reconfigurable circuit designs.

BACKGROUND

Field programmable gate arrays (FPGAs), first introduced by Xilinx in 1985, are becoming increasingly popular devices for use in electronic systems. For example, communications systems employ FPGAS. In general, the use of FPGAs continues to grow at a rapid rate because they permit relatively short design cycles, reduce costs through logic consolidation, and offer flexibility in their re-programmability.

The field of reconfigurable computing has advanced steadily for the past decade, using FPGAs as the basis for high-performance reconfigurable systems. Run-Time Reconfigurable (RTR) systems distinguish themselves by performing circuit logic and routing customization at run-time. RTR systems using FPGAs are expected to result in systems that require less hardware, less software, and fewer input/output resources than traditional FPGA-based systems. However, scarcity of software that supports RTR is believed to be one reason that RTR has been outpaced by research in other areas of reconfigurable computing.

Whereas with traditional configuration of FPGAs the time taken to generate a programming bitstream is generally not real-time critical, with RTR systems, the time required to generate the programming bitstream may be critical from the viewpoint of a user who is waiting for the FPGA to be reconfigured. Thus, it may be acceptable in traditional implementation scenarios to take hours to generate a programming bitstream using traditional configuration methods. In an RTR environment, however, it is expected that the reconfiguration process require no more than a few seconds or even a fraction of a second.

Reconfiguration of an FPGA may include routing and rerouting connections between the logic sections. Routers in a traditional configuration process generally route connections for all the circuit elements. That is, these routers define connections for all the circuit elements in a design, expending a great deal of time in the process. In an RTR environment, traditional routing methods are inappropriate given the real-time operating constraints. Present run-time routing methods provide a great deal of program control over the routing process. For example, the JBits program from Xilinx allows a program to manipulate individual bits in the configuration bitstream for configuring interconnect resources.

The techniques described by Keller, Guccione, and Levi in the patent application entitled, "RUN-TIME ROUTING FOR PROGRAMMABLE LOGIC DEVICES" include programming interfaces that can be called to automatically route from one connection to another. The programming interface, called "JRoute", alleviates having to write code that routes signals and manipulates individual interconnect resources in a run-time reconfigurable application.

In some instances it may be desirable for a RTR application to include high-level program calls to route connections. For example, if the RTR application contains a black box function which can have many different interfaces, then it would be more desirable to use JRoute to connect the black box to the rest of the design. In general using JBits versus using JRoute is a compromise between speed and flexibility, JBits being faster and JRoute being more flexible. However, for other applications the time spent rerouting with each reconfiguration may be unnecessary.

A method and apparatus that addresses the aforementioned problems, as well as other related problems, is therefore desirable.

SUMMARY OF THE INVENTION

A method and apparatus for developing run-time parameterizable logic cores for programmable logic devices (PLDS) are provided in various embodiments of the invention. In one embodiment, run-time parameterizable logic cores are defined in a run-time reconfiguration program, the logic cores having various output pins and input pins. A pre-route tool routes selected ones of the output pins to selected ones of the input pins and generates program code for the run-time reconfiguration program. The program code generated by the pre-route tool programs interconnect resources that make the required connections. The automatically generated program code is then parameterized and included in the run-time reconfiguration program.

Various other embodiments are set forth in the Detailed Description and claims which follow.

DETAILED DESCRIPTION

Figure 1:
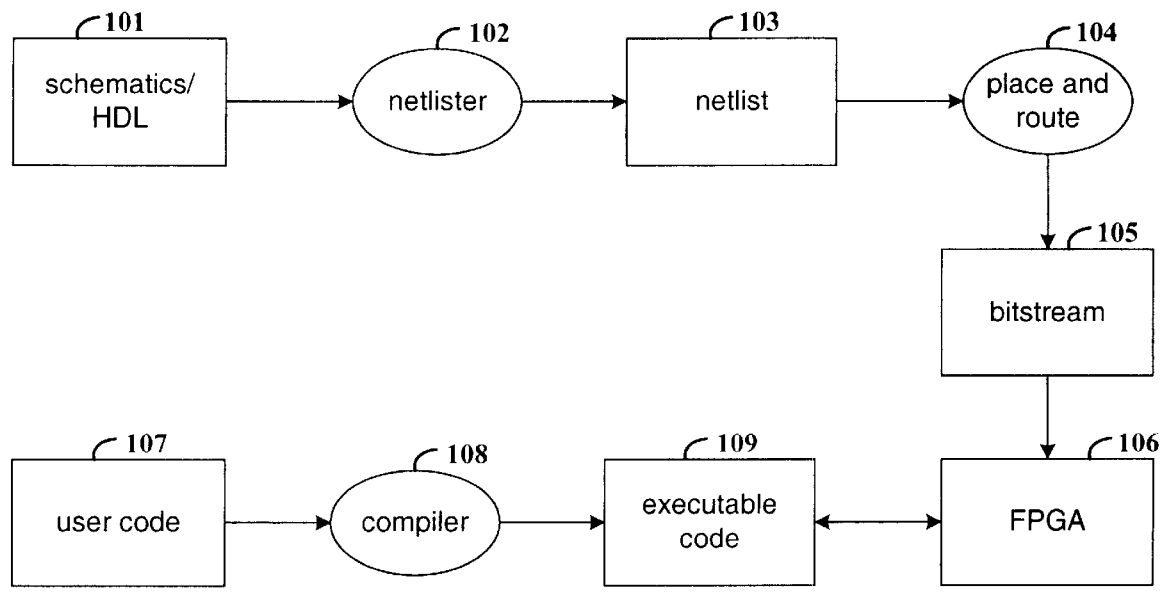
FIG. 1 is a flow chart illustrating the design of a circuit implemented in an FPGA using a reconfigurable logic coprocessor.

Design of a circuit implemented in an FPGA using a reconfigurable logic coprocessor currently requires a combination of two distinct design paths, as shown in FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a netlist 103 for the design, importing this netlist into an FPGA placement and routing tool 104, which finally generates a bitstream file 105 of configuration data used to configure the FPGA 106.

Once the configuration data has been produced, the next task is to provide software to interface the processor to the FPGA. The user enters user code 107 describing the user interface instructions, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process is time consuming, with the place and route portion of the chain typically taking several hours to complete.

Finally, this approach provides no support for run-time reconfiguration. The traditional hardware design tools provide support almost exclusively for static design. It is difficult to imagine constructs to support run-time reconfiguration in environments based on schematic or HDL design entry.

Figure 2:
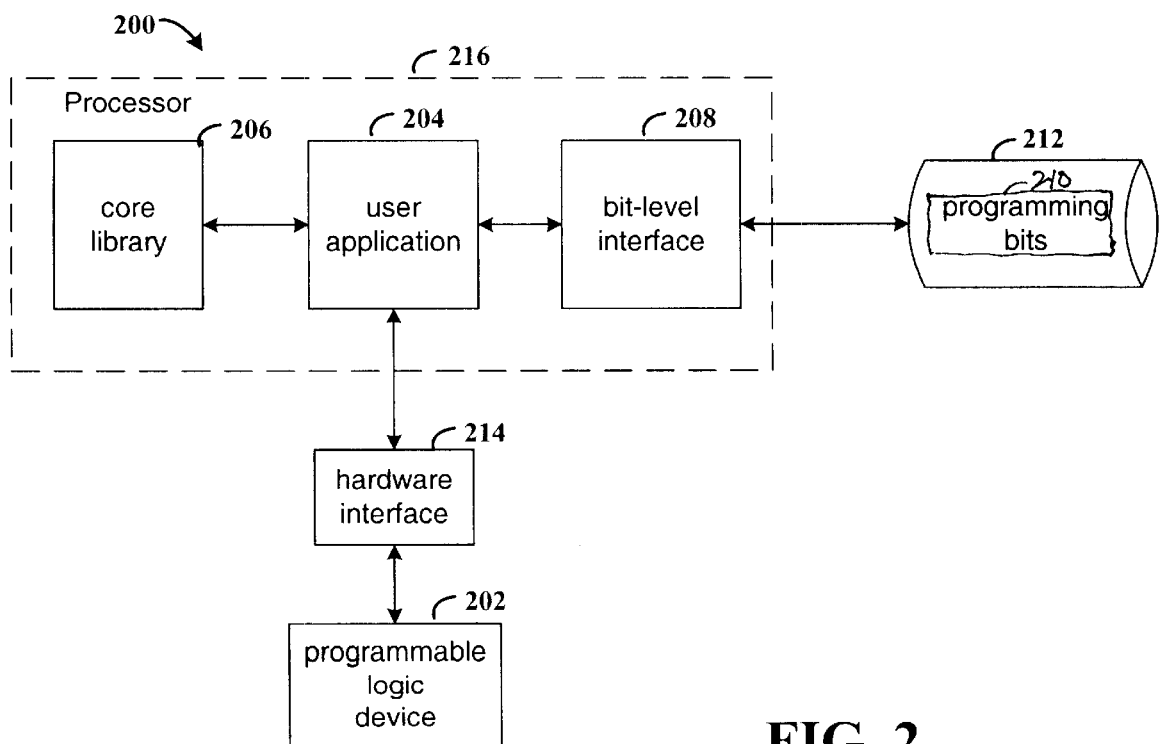
FIG. 2 is a block diagram of a system for configuration of a programmable logic device, according to one embodiment of the invention.

FIG. 2 is a block diagram of a system 200 for configuration of a programmable logic device 202, according to one embodiment of the invention. It will be appreciated that system 200 also supports run-time reconfiguration of the programmable logic device 202.

System 200 includes a user application program 204 that is written in the Java® language, for example. The application program 204 may be written to perform various functions relative to the environment in which system 200 is used. For example, in addition to configuration and/or run-time reconfiguration of programmable logic device 202, the user application program 204 may provide user-interface functions and/or digital signal processing.

Core library 206 is a collection of macrocell or "core" generators that are implemented as Java classes. The cores are generally parameterizable and relocatable within a device. Examples of cores include counters, adders, multipliers, constant adders, constant multipliers, flip-flops and other standard logic and computation functions.

Bit-level interface 208 includes an application program interface that allows the user application program 204 to manipulate configurable resources of programmable logic device 202. The bit-level interface also includes a set of functions, one or more of which are invoked when the user application program 204 references the application program interface. The set of functions in the bit-level interface manipulate selected ones of programming bits 210, based on the type of programmable logic device. For example, some of the functions in the set may be programmed for certain devices in the XC4000 family of FPGAs from Xilinx, and others of the functions may programmed for other devices in the Virtex™ FPGA family from Xilinx. Bit-level interface software is generally understood by those skilled in the art. For example, bit-level interface 208 includes the JBits software from Xilinx.

The programming bits are stored in storage element 212. Storage element 212 may be magnetic, optical, electronic, or a suitable combination thereof that is readable and writable.

While in the example embodiment, core library 206, user application 204, and bit-level interface 208 are written in Java, it will be appreciated that many other languages would also be suitable.

Hardware interface 214 includes a portable layer of software and accompanying hardware to couple application program 204 to programmable logic device 202. For example, hardware interface 214 may be the Xilinx Hardware Interface (XHWIF) which is available from XILINX.

Processor 216 is coupled to programmable logic device 202 via hardware interface 214. The functional requirements of system 200 dictate the particular style and capabilities of processor 216. For example, some applications may call for a RISC based processor while others may call for a CISC. Various special purpose or general purpose processors from manufacturers such as Intel, Sun Microsystems, Motorola, IBM, AMD and others may be suitable.

In various embodiments, the invention generally supports development of run-time reconfigurable applications. The run-time reconfiguration routines described in the cross-referenced application/patent entitled "RUN-TIME ROUTING FOR PROGRAMMABLE LOGIC DEVICES" by Eric Keller et al., provide an application programming interface for developing run-time reconfigurable applications. The routines provide a high-level programming interface for programming run-time routing tasks. While the high-level programming interface is useful for removing from the developer the task of manually routing signals, the routines take more time to execute during reconfiguration than if no routing was needed. In some instances, it may be desirable to have some logic cores "pre-routed". That is, it may be desirable to route signals prior to run-time reconfiguration, leaving only the task of setting interconnect resource bits at run-time reconfiguration. Pre-routing can be used to save time in the run-time reconfiguration process.

There are many RTR applications where the run-time modifications are made to core parameters only. The routing changes associated with this type of RTR application can be handled within a pre-routed core. In addition, applications that dynamically swap cores to and from the PLD and that use JRoute to connect the cores may benefit from pre-routed cores. Generally, any relatively static part of the design may be suitable for pre-routing. Also, any part of a design that is re-used frequently, particularly switched in and out frequently, is suitable for pre-routing.

Figure 3:
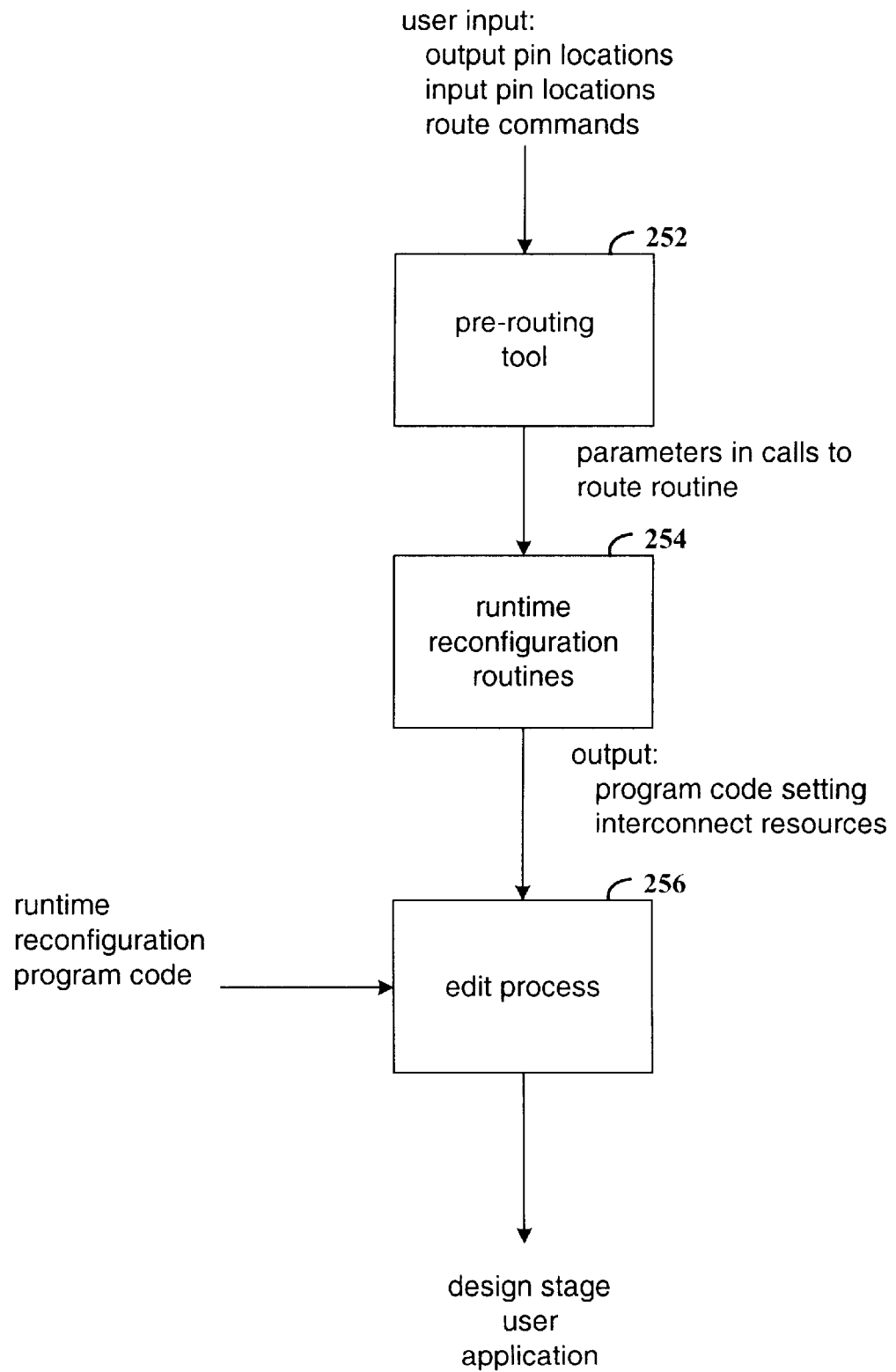
FIG. 3 is a data flow diagram associated with the process for generating a pre-routed design in accordance with one embodiment of the invention.

FIG. 3 is a data flow diagram associated with the process for generating a pre-routed design in accordance with one embodiment of the invention. The blocks in the figure represent a combination of design tools and manual or automated processing, and the directional arrows represent data input to and output from the processes.

Pre-routing tool 252 receives pin locations and instructions to connect them together, and calls JRoute run-time reconfiguration routines to pre-route the design. The input data include output pin locations, input pin locations, and route commands. The route commands specify which output pins are to be routed to which input pins. In general, the pre-routing tool generates program code that can be used in conjunction with a user application (for example, application 204 in FIG. 2). The program code consists of bit-level interface program calls that program specific interconnect resources of the PLD.

The route commands are input by the user map to run-time reconfiguration routines 254. For example, the cross-referenced application/patent entitled, "RUN-TIME ROUTING FOR PROGRAMMABLE LOGIC DEVICES" by Eric Keller et al., sets forth routines for performing run-time routing tasks. These routines select suitable PLD interconnect resources for routing the specified pins. For the purposes of the present invention, the run-time routing routines are used outside the run-time reconfiguration environment. That is, in the development environment, the routines are used to route selected portions of a logic core. The output from the routines includes bit-level interface code that programs specific PLD interconnect resources. The designer is thereby freed from having to manually route the selected pins, and the time required for run-time reconfiguration can be reduced since the pins have been pre-routed.

Block 256 represents the process of editing the program code that sets the interconnect resources along with the application with which the code is integrated. Since specific interconnect resources are programmed in the code generated by the run-time reconfiguration routines, the code must be changed if a change in parameters is desirable. For example, if the code is generated for a particular size adder, the automatically generated code will reference a fixed set of interconnect resources. To change the code to accommodate adders of different sizes, the code that references specific interconnect resources can be changed by an index and an offset to reference a different number of interconnect resources, with the code in a programming loop that iterates for the size of the adder. The placement of the resulting core can be made adjustable by changing the code to reference placement variables rather than absolute locations.

Figure 4:
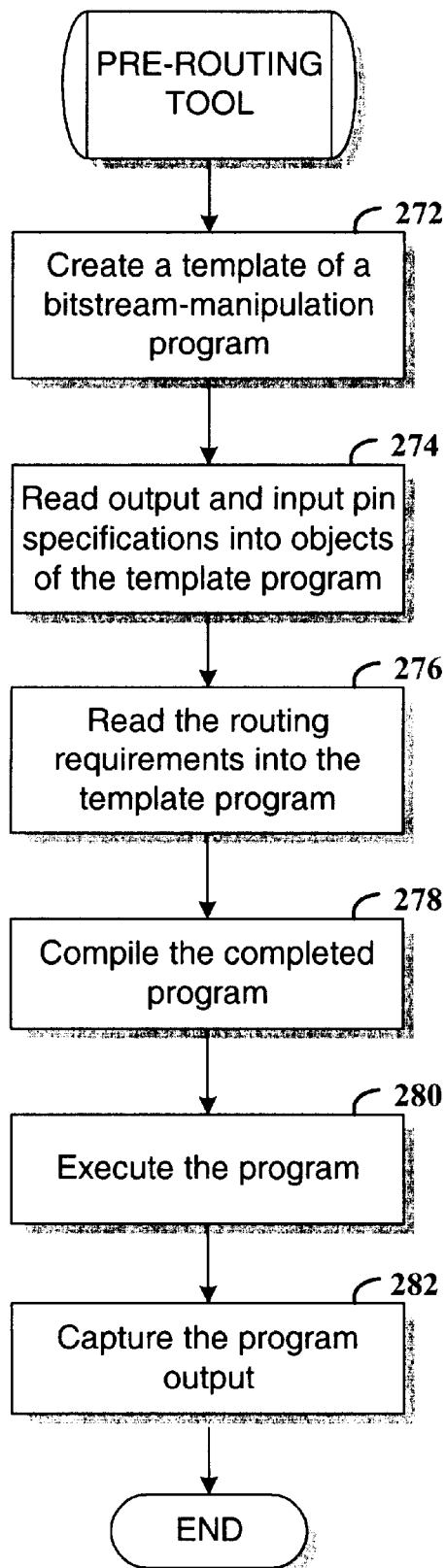
FIG. 4 is a flowchart of a process implemented by the pre-routing tool in accordance with one embodiment of the invention.

FIG. 4 is a flowchart of a process implemented by the pre-routing tool in accordance with one embodiment of the invention. In the example embodiment, the process is implemented in the Java language for purposes of compatibility with the route routines called by the tool. Those skilled in the art will appreciate that the tool could be implemented using other object oriented programming language or other types of languages, depending on the particular implementation of the run-time reconfiguration environment.

At step 272, a template is created of a program that manipulates the configuration bitstream. The template program is a Java program that imports selected JBits and JRoute packages. The program defines a new class and creates a main method which runs when the class is executed. The method creates the JBits and JRoute objects and then loads a null bitstream into the JBits object. User input is then inserted into a "try" block. If the user input causes an exception condition, the program exits with an error message. Finally, the time taken to execute the program is printed out. An example template is shown below:

```
$CODE=<<EOF;
    import      com.xilinx.JBits.Virtex.JBits;
    import      com.xilinx.JBits.Virtex.Devices;
    import      com.xilinx.JBits.Virtex.ConfigurationException;
    import      com.xilinx.JBits.Virtex.Bits.*;
    import      com.xilinx.JBits.Virtex.RTPCore.*;
    import   com.xilinx.JRoute.Virtex.Router.*;
    import   com.xilinx.JRoute.Virtex.ResourceDB.*;
    import   java.util.*;
    // import com.xilinx.JRoute.Virtex.ResourceUsage.*;
    public class $PROG
    {
        public static void main (String[ ] args)
        {
            Router router;
            JBits jbits;
            int deviceType = Devices.XCV800;
            String infileName = "/web/loki/cgi-bin/Routing/JCode/null.bit";
            jbits = new JBits(deviceType);
            try {
                jbits.read(infileName);
            } catch (Exception e) {
                System.out.println("Could not read in bitstream from file " + infileName + ". Exiting.");
                System.exit(-4);
            } /* end catch( ) */
            router = new Router(jbits, System.out);
            /* Start Timer */
            long start = System.currentTimeMillis( );
            /* Jroute Code goes here */
    try {
    $routes
    }
    catch (RouteException re) {
        System.out.println(re.toString( ));
        System.out.println("Exiting.");
        System.exit(-5);
    } /* end catch( ) */
            /* StopTimer */
            long stop = System.currentTimeMillis( );
            System.out.println("\\n\\n<b>Execution Time: "+(stop-start)+" ms<b>");
        }
    }
    EOF
```

At step 274, the tool reads a first set of input data from the user. The first set of input data identifies the output pins and the input pins that are to be connected. The format of the input data corresponds to instantiations of objects, and the input data is written to the template program.

A second set of user input data is the routing requirements, which are read at step 276. The routing requirements specify which output pins are to be routed to which input pins. The format of the routing requirements corresponds to calls to the route routines to perform the routing tasks. Thus, the specified routing requirements can be written to the template program.

At step 278, the program (the template program plus the pin and routing specifications) is compiled. The program is executed at step 280, and the program output is captured at step 282. The program output is a sequence of program calls to JBits routines for setting bits to program interconnect resources of the PLD. The output program calls can then be edited and integrated with the user's application.

Figure 5:
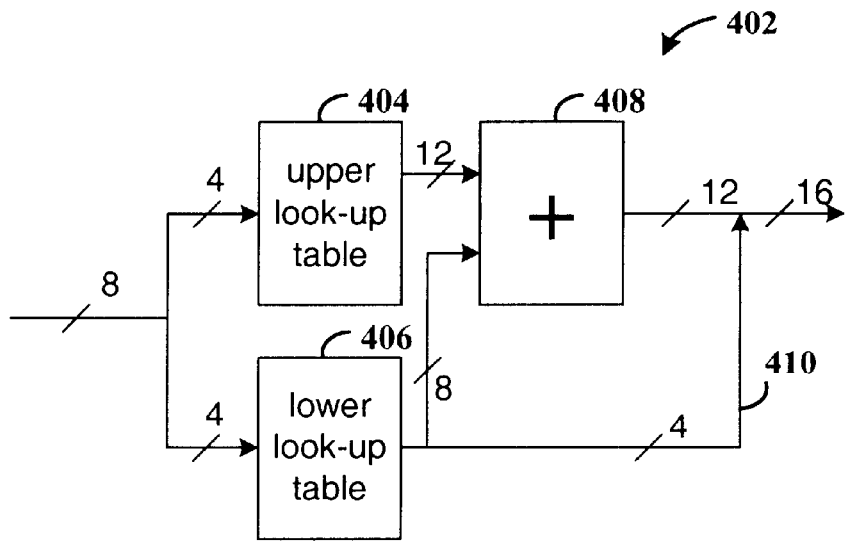
FIG. 5 shows a block level diagram of an example eight-bit constant coefficient multiplier (KCM).
Figure 6:
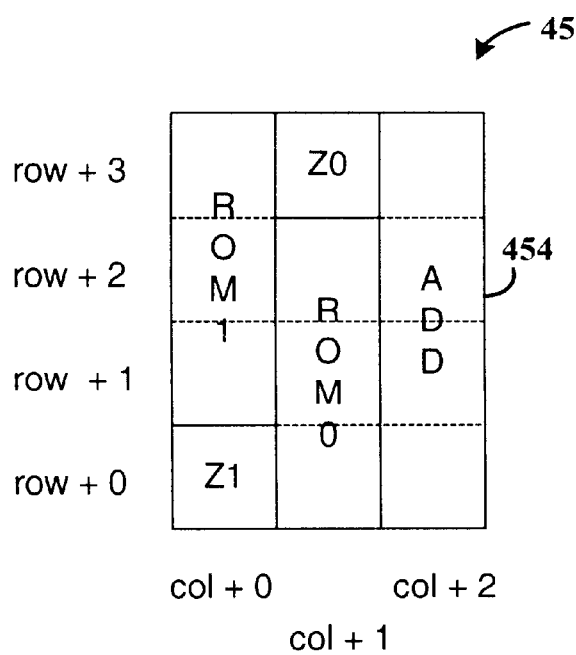
FIG. 6 illustrates an example layout for a constant multiplier logic core.
Figure 7:
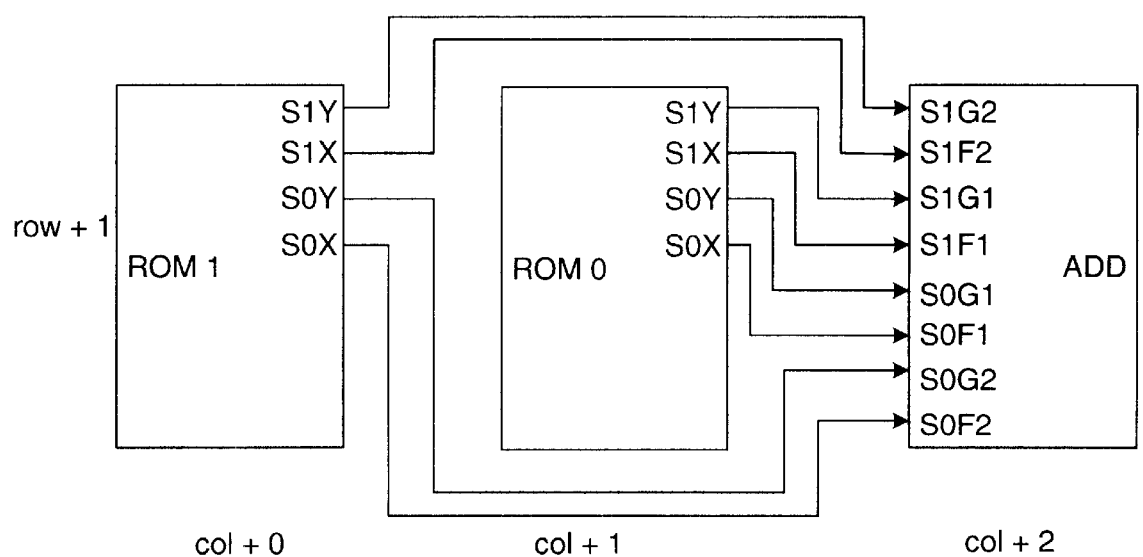
FIG. 7 shows how a single stage of the constant coefficient multiplier core is connected.

FIGS. 5, 6, and 7, together with the example code below, set forth an example that involves pre-routing a run-time parameterizable constant multiplier core. FIG. 5 shows a block level diagram of an example eight-bit constant coefficient multiplier (KCM). KCM 402 simplifies the task of multiplying a variable by a constant k. KCM 402 holds a number of copies of the multiplication table for k, each copy containing 16 entries. The tables contain the products of k*0, k*1, k*2, to k*15. When multiplying an n-bit variable by a constant, n/4 copies of the table are required. Since the variable is 8 bits in the example, there are two copies of the multiplication table for k: table 404 and table 406.

The nibbles that comprise the Variable are used to address the tables (each nibble consisting of 4 of the bits). Since the variable is 8 bits, the top 4 bits address table 404, and the bottom 4 bits address table 406. The output from tables 404 and 406 are partial products of the constant and the input variable. The partial products are summed in adder 408 to obtain the result. The 4 bits from table 406 that bypass the adder on line 410 are the LSBs.

This example further uses the fact that the JBits software from Xilinx includes a set of primitive run-time parameterizable logic cores (RTPCores). These RTPCores are relatively placed and pre-routed so they can be written into a bitstream very quickly. The RTPCores include, for example, ROM, constant, and adder logic cores, which can be used to build a KCM RTPCore. An initial step is to determine which RTPCores to use and how the cores should be laid out.

FIG. 6 illustrates an example layout for a constant multiplier logic core. The example layout uses two 16×12 ROM cores, two constant cores (Z0 and Z1), and one adder core. Each of the individual cores in this example are optimized and pre-routed. Since the KCM core is built from optimized components, it can be implemented in 12 configurable logic blocks (CLBs) of an FPGA, for example.

Four partial rows and three partial columns of CLBs in an FPGA are illustrated. The rows and columns are labeled in terms of base+offset. For example, The entire KCM occupies rows row+0 through row+3, where row is the base. The layout of the logic cores is shown relative to the illustrated CLBs. For example, the adder occupies the CLBs in column col+2 at rows row+0 through row+3. Z0 and Z1 are the constant logic cores, and ROM0 and ROM1 are the ROM logic cores that implement multiplication tables 404 and 406, respectively.

Layout 452 of the core is an implementation of the KCM where the LSBs of the lower table do not bypass the adder as illustrated by KCM 402 of FIG. 5. Instead, adder 454 handles 16 bits: the lower 4 bits of 12-bit ROM0 (corresponding to table 406 of FIG. 5) are added with zero core Z1. A zero value from zero core Z1 is added to the 4 MSBs of ROM 1 (corresponding to table 404 of FIG. 5). The four-bit zero value in Z1 effectively multiplies the value of ROM1 by 16, and the four-bit zero value in Z0 is a place-holder. The zero constant cores Z0 and Z1 make the routing to adder 452 the same for each stage. The output values of cores 402 and 452 are the same, but the routing of core 452 is simplified. Adder 454 also registers the output value of core 452.

The following example illustrates operation of KCM 452. The example assumes that the constant is $255_{10}$ or $FF_{16}$. Tables 404 and 406, therefore, have the following values.

| 0: 0   | 4: 3FC | 8: 7F8  | 12: BF4 |
|--------|--------|---------|---------|
| 1: FF  | 5: 4FB | 9: 8F7  | 13: CF3 |
| 2: 1FE | 6: 5FA | 10: 9F6 | 14: DF2 |
| 3: 2FD | 7: 6F9 | 11: AF5 | 15: EF1 |

If the input variable is $F5_{16}$ ($245_{10}$), then the least significant nibble, 5, addresses the value 4FB ($1275_{10}$) in ROM0 (table 406), and the most significant nibble, F, addresses the value EF1 ($3825_{10}$) in ROM1 (table 404). When the values are output in accordance with layout 452, the following alignment of nibbles results:

|         | col + 0 | col + 1 |
|---------|---------|---------|
| row + 3 | E       | 0       |
| row + 2 | F       | 4       |
| row + 1 | 1       | F       |
| row + 0 | 0       | B       |

The zero below ROM1 effectively multiplies EF1 by 16 ($61200_{10}$). Adding EF10+04FB is F40B ($61200_{10}+1275_{10}=62475_{10}=255_{10}*245_{10}$).

The program code below shows the set method of a Jbits KCM RTPCore. The set method initializes and places the component cores as illustrated in FIG. 6. At the end of the set method a call is made to the RomsToAdderStitcher ( ), which performs the routing for this core. The code for the RomsToAdderStitcher ( ) method will be created using pre-routing tool 252. The code is annotated with comments that describe the functionality of the code.

```
/** This method creates an eight bit constant coefficient
    multiplier
** out of existing RTPCores and writes it to a bitstream.
** @param jBits The bitstream that is modified
** @param constantValue The k value of the multiplier
** @param row The row location
** @param col The col location
**/
public void set (JBits jBits, int constantValue, int row,
int col)
    throws ConfigurationException {
    /* Define RTPCores that will be used */
    Rom16byX rom0, rom1;
    Constant z0, z1;
    FastAdder add;
    /* Define Array for Rom values */
    int [ ] romValues=new int[16];
    /* set ROM values */
    for (int i=0; i<16; i++) {
        romValues[i]=constantValue * i;
    }
    /* Create all of the RTPCores */
    /* Create the ROMs */
    rom0=new       Rom16byX(12,romValues,
        Rom16byX.BOTHSLICES);
    rom1=new       Rom16byX(12,romValues,
        Rom16byX.BOTHSLICES);
    /* Create Zero Constants
    * Four bits per CLB, implemented using both slices */
    z0=new Constant(4,0,Constant. BOTHSLICES);
    z1=new Constant(4,0,Constant. BOTHSLICES);
    /* Create 16 bit adder */
    add=new FastAdder(16, FastAdder BOTHSLICES);
    /* Now layout the RTPCores according to FIG. 6 */
    /* Layout the ROMs */
    rom0.set(jBits,row,col+1);
    rom1.set(jBits,row+1,col);
```

```
/* Layout the Zero Constants */
z0.set(jBits,row+3,col+1);
z1.set(jBits,row,col);
/* Layout the adder */
add.set(jBits,row,col+2);
/* Now that the cores are all placed, stitch them together
 */
int size=4; // number of stages to stitch
RomsToAdderStitcher(jBits, row, col, size);
}
```

After coding the layout for the ROMs, constants, and adder, the example continues with finding the logical connections between the ROMs and the adder. Each stage of the ROMs must be connected to the adder stage of the same row. The ROMs have four output ports per stage (CLB), and the four output ports are designated as S0X, S0Y, S1X and S1Y in order of LSB to MSB. An adder stage (CLB) thus has eight input ports.

FIG. 7 shows how a single stage of the constant multiplier core is connected at row+1. Each "stage" of the constant multiplier core is a row of CLBs. Block 452 represents the stage of ROM 1 in the CLB at row+1, col+0; block 454 represents the stage of ROM 0 in the CLB at row+1, col+1; and block 456 represents the stage of the adder in the CLB at row+1, col+2. The zero constant cores output a constant zero on the associated S1Y, S1X, S0Y, S0X output ports and can be routed in a manner comparable to the ROM stages. Since all the rows have the same logical routing, all stages can be routed the same way once a solution for routing one stage is found. The pre-route tool can be used to figure out the routing for one stage.

The example input data below illustrates the output and input pin specifications and the desired logical routing between the pins. In one embodiment, a browser user interface is used for reading input data from the user.

```
/* Define specific row and column */
int row=5, col=5;
/* Define ROM output pins */
Pin rom0_s1y=new Pin (row, col+1, Wires.S1_Y);
Pin rom0_s1x=new Pin (row, col+1, Wires.S1_X);
Pin rom0_s0y=new Pin (row, col+1, Wires.S0_Y);
Pin rom0_s0x=new Pin (row, col+1,.Wires.S0_X);
Pin rom1_s1y=new Pin (row, col, wires.S1_Y);
Pin rom1_s1x=new Pin (row, col, Wires.S1_X);
Pin rom1_s0y=new Pin (row, col, Wires.S0_Y);
Pin rom1_s0x=new Pin (row, col, wires.S0_x);
/* Define Adder input pins */
Pin add_s1g2=new Pin (row, col+2, Wires.S1G2);
Pin add_s1f2=new Pin (row, col+2, Wires.S1F2);
Pin add_s1g1=new Pin (row, col+2, Wires.S1G1);
Pin add_s1f1=new Pin (row, col+2, Wires.S1F1);
Pin add_s0g1=new Pin (row, col+2, Wires.S0G1);
Pin add_s0f1=new Pin (row, col+2, Wires.S0F1);
Pin add_s0g2=new Pin (row, col+2, Wires.S0G2);
Pin add_s0g2=new Pin (row, col+2, Wires.S0F2);
/* Route the pins together */
router.route (rom0_s1y, add_s1g1);
router.route (rom0_s1x, add_s1f1);
router.route (rom0_s0y, add_s0g1);
router.route (rom0_s0x, add_s0f1);
router.route (rom1_s1y, add_s1g2);
router.route (rom1_s1x, add_s1f2);
router.route (rom1_s9y, add_s0g2);
router.route (rom1_s0x, add_s0f2);
```

There are three major sections in the input data listed above. The variables row and col are both initialized to a specific value (5 in the example). The example values are arbitrary. However, specific values must be used because the pre-route tool routes between specific PLD pins. Next, the output pins (ROMs) and adder input pins are defined. Finally the connections between the output pins and adder pins are specified using the syntax of the router.route( ) method. The router.route( ) method is described in the cross-referenced application/patent for run-time routing. Since the input data above is used for generating specific JBits code for connecting the pins and the example code is intended to be further tailored for an example application, and the zero cores have the same output pins as the ROMs, the input data does not include specific reference to the zero cores.

The text below illustrates example output from the pre-route tool in response to the input data set forth above.

```
jbits.set (5, 6, OUT1.OUT1, OUT1.S1_Y);
jbits.set (5, 6, OutMuxToSingle.OUT1_TO_SINGLE_
    EAST3, OutMuxToSingle.ON);
jbits.set (5, 7, S1G1.S1G1, S1G1.SINGLE_WEST3);
jbits.set (5, 6, OUT3.OUT3, OUT3.S1_X);
jbits.set (5, 6, OutMuxToSingle.OUT3_TO_SINGLE_
    EAST11, OutMuxToSingle.ON);
jbits.set (5, 7, S1F1.S1F1, S1F1.SINGLE_WEST11);
jbits.set (5, 6, OUT5.OUT5, OUT5.S0_Y);
jbits.set (5, 6, OutMuxToSingle.OUT5_TO_SINGLE_
    EAST17, OutMuxToSingle.ON);
jbits.set (5, 7, S0G1.S0G1, S0G1.SINGLE_WEST17);
jbits.set (5, 6, OUT6.OUT6, OUT6.S0_X);
jbits.set (5, 6, OutMuxToSingle.OUT6_TO_SINGLE_
    EAST18, OutMuxToSingle.ON);
jbits.set (5, 7, S0F1.S0F1, S0F1.SINGLE_WEST18);
jbits.set (5, 5, OUT2.OUT2, OUT2.S1_Y);
jbits.set (5, 5, OutMuxToSingle.OUT2_TO_SINGLE_
    EAST6, OutMuxToSingle.ON);
jbits.set (5, 6, SingleToSingle.SINGLE_WEST6_
    TOSINGLE_EAST6, SingleToSingle.ON);
jbits.set (5, 7, S1G2.S1G2, S1G2.SINGLE_WEST6);
jbits.set (5, 5, OUT3.OUT3, OUT3.S1_X);
jbits.set (5, 5, OutMuxToSingle.OUT3_TO_SINGLE
    EAST8, OutMuxToSingle.ON);
jbits.set (5, 6, SingleToSingle.SINGLE_WEST8_
    TOSINGLE_EAST8, SingleToSingle.ON);
jbits.set (5, 7, S1F2.S1F2, S1F2.SINGLE_WEST8);
jbits.set (5, 5, OUT0.OUT0, OUT0.S0—Y);
jbits.set (5, 5, OutMuxToSingle.OUT0_TO_SINGLE_
    EAST2, OutMuxToSingle.ON);
jbits.set (5, 6, SingleToSingle.SINGLE_WEST2_
    TOSINGLE_EAST2, SingleToSingle.ON);
jbits.set (5, 7, S0G2.S0G2, S0G2.SINGLE_WEST2);
jbits.set (5, 5, OUT7.OUT7, OUT7.S0_X);
jbits.set (5, 5, OutMuxToSingle.OUT7_TO_SINGLE_
    EAST20, OutMuxToSingle.ON);
jbits.set (5,6, SingleToSingle.SINGLE_WEST20_TO_
    SINGLE_EAST20, SingleToSingle.ON);
jbits.set (5, 7, S0F2.S0F2, S0F2.SINGLE_WEST20);
```

The output data from the pre-route tool are specific jbits.set commands to set the interconnect resources that form a route for the specified connections. The routes are determined by the route routine described in the cross-referenced application/patent for run-time routing. For example, for a particular PLD such as the Virtex FPGA from Xilinx, the route routine finds available output multiplexers and available hex/singles lines and avoids contention on the user-specified routes.

Each of the jbits.set commands references a particular interconnect resource relative to a particular CLB that is referenced by row and column parameters. For example, the last command:

jbits.set (5, 7, S0F2.S0F2, S0F2.SINGLE_WEST20);

references interconnect resources at row 5, column 7. The S0F2.S0F2 parameter is slice 0 of the CLB at row 5, column7, address pin 2 of the F LUT, and the S0F2.SINGLE_WEST20 parameter specifies that the routing line, SINGLE_WEST20 will drive the S0F2 pin. Additional details on interconnect resources and manipulation of the resources in the JBits environment can be found in JBits documentation available from Xilinx.

The output data from the pre-route tool can be used to define the RomsToAdderStitcher( ) method called from the previously described set method for the KCM core. The output data can be copied to a for loop and the absolute row and col parameters can be replaced with variables that take values from input parameters ("parameterization"). The variables permit the constant multiplier core to be parameterized in terms of placement and size. The code below shows the result of this editing.

```
/**
 * This method stitches together two ROMs to an adder.
 */
private void RomsToAdderStitcher(JBits jbits, int row, int
col, int size)
        throws ConfigurationException {
        /* Connect ROMs to Adder */
        for (int i=0; i<size; i++) {
            /* Connect ROM0 S1Y to Add S1G1 */
            jbits.set(row+i, col+1, OUT1.OUT1, OUT1.S1_Y );
            jbits.set(row+i, col+1,
OutMuxToSingle.OUT1_TO_SINGLE_EAST3, OutMuxToSingle.ON );
            jbits.set(row+i, col+2, S1G1.S1G1, S1G1.SINGLE_WEST3
);
            /* Connect ROM0 S1X to Add S1F1 */
            jbits.set(row+i, col+1, OUT3.OUT3, OUT3.S1_X );
            jbits.set(row+i, col+1,
OutMuxToSingle.OUT3_TO_SINGLE_EAST11, OutMuxToSingle.ON );
            jbits.set(row+i, col+2, S1F1.S1F1, S1F1.SINGLE_WEST11
);
            /* Connect ROM0 S0Y to Add S0G1 */
            jbits.set(row+i, col+1, OUT5.OUT5, OUT5.S0_Y );
            jbits.set(row+i, col+1,
OutMuxToSingle.OUT5_TO_SINGLE_EAST17, OutMuxToSingle.ON );
            jbits.set(row+i, col+2, S0G1.S0G1, S0G1.SINGLE_WEST17
);
            /* Connect ROM0 S0X to Add S0F1 */
            jbits.set(row+i, col+1, OUT6.OUT6, OUT6.S0_X );
            jbits.set(row+i, col+1,
OutMuxToSingle.OUT6_TO_SINGLE_EAST18, OutMuxToSingle.ON );
            jbits.set(row+i, col+2, S0F1.S0F1, S0F1.SINGLE_WEST18
);
            /* Connect ROM1 S1Y to Add S1G2 */
            jbits.set(row+i, col, OUT2.OUT2, OUT2.S1_Y );
            jbits.set(row+i, col,
OutMuxToSingle.OUT2_TO_SINGLE_EAST6, OutMuxToSingle.ON );
jbits.set(row+i, col+1, SingleToSingle.SINGLE_WEST6_TO_SINGLE
_EAST6,
SingleToSingle.ON);
            jbits.set(row+i, col+2, S1G2.S1G2, S1G2.SINGLE_WEST6
);
            /* Connect ROM1 S1X to Add S1F2 */
            jbits.set( row+i, col, OUT3.OUT3, OUT3.S1_X );
            jbits.set( row+i, col,
OutMuxToSingle.OUT3_TO_SINGLE_EAST8, OutMuxToSingle.ON );
            jbits.set( row+i,
col+1, SingleToSingle.SINGLE_WEST8_TO_SINGLE_EAST8,
SingleToSingle.ON);
            jbits.set( row+i, col+2, S1F2.S1F2, S1F2.SINGLE_WEST8
);
            /* Connect ROM1 S0Y to Add S0G2 */
            jbits.set( row+i, col, OUT0.OUT0, OUT0.S0_Y );
            jbits.set( row+i, col,
OutMuxToSingle.OUT0_TO_SINGLE_EAST2, OutMuxToSingle.ON );
            jbits.set( row+i,
col+1, SingleToSingle.SINGLE_WEST2_TO_SINGLE_EAST2,
SingleToSingle.ON);
            jbits.set( row+i, col+2, S0G2.S0G2, S0G2.SINGLE_WEST2
);
```

-continued

```
        /* Connect ROM1 S0X to Add S0F2 */
        jbits.set(row+i, col, OUT7.OUT7, OUT7.S0_X );
        jbits.set( row+i, col,
OutMuxToSingle.OUT7_TO_SINGLE_EAST20, OutMuxToSingle.ON );
        jbits.set(row+i,
col+1, SingleToSingle.SINGLE_WEST20_TO_SINGLE_EAST20,
SingleToSingle.ON);
        jbits.set( row+i, col+2, S0F2.S0F2,
S0F2.SINGLE_WEST20 );
    }
}
```

The completed set method for the constant coefficient multiplier initializes and places the components and then calls the RomsToAdderStitcher method to program the interconnections. Since the RomsToAdderStitcher method programs specific interconnect resources (instead of calling the route method, for example), the core is pre-routed and run-time reconfiguration need not expend time routing. The pre-route tool and process assists in the production of a pre-routed logic core and relieves the designer from having to manually route selected portions of the design.

The present invention is believe to be applicable to a variety of processes for implementing circuit designs and has been found to be particularly applicable and beneficial in PLDs. While the present invention is not so limited, an appreciation of the present invention has been provided by way of specific examples involving PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for developing run-time parameterizable logic cores for a programmable logic device having programmable interconnect resources, comprising:

defining at least one run-time parameterizable logic core in a run-time reconfiguration program, the logic core having a set of output pins and a set of input pins;

in response to input data specifying required connections from the output pins to the input pins, automatically selecting a subset of programmable interconnect resources to make the required connections and automatically generating pre-routed program code to program the subset of programmable interconnect resources;

parameterizing the pre-routed program code; and including the parameterized program code in the run-time reconfiguration program.

2. The method of claim 1, wherein the input data further comprises references to rows and columns of configurable logic blocks of the programmable logic device.

3. The method of claim 2, wherein the input data further comprises object instantiations of the output pins and the input pins.

4. The method of claim 3, wherein the input data further comprises calls to methods that rout e between an output pin and an input pin.

5. The method of claim 4, further comprising:
   creating a stitcher method in the run-time reconfiguration program; and
   including the parameterized program code in the stitcher method.

6. The method of claim 1, wherein the input data further comprises object instantiations of the output pins and the input pins.

7. The method of claim 1, wherein the input data further comprises calls to methods that route between an output pin and an input pin.

8. The method of claim 1, further comprising:
   creating a stitcher method in the run-time reconfiguration program; and
   including the parameterized program code in the stitcher method.

9. The method of claim 1, further comprising:
   creating a template of a bitstream-manipulation program;
   inserting the input data into the template program, resulting in a completed program;
   compiling the completed program, resulting in an compiled program; and
   executing the compiled program.

10. The method of claim 9, wherein the input data further comprises references to rows and columns of configurable logic blocks of the programmable logic device.

11. The method of claim 10, wherein the input data further comprises object instantiations of the output pins and the input pins.

12. The method of claim 11, wherein the input data further comprises calls to methods that route between an output pin and an input pin.

13. The method of claim 12, further comprising:
    creating a stitcher method in the run-time reconfiguration program; and
    including the parameterized program code in the stitcher method.

14. The method of claim 9, wherein the input data further comprises object instantiations of the output pins and the input pins.

15. The method of claim 9, wherein the input data further comprises calls to methods that route between an output pin and an input pin.

16. The method of claim 9, further comprising:
    creating a stitcher method in the run-time reconfiguration program; and
    including the parameterized program code in the stitcher method.

17. An apparatus for developing run-time parameterizable logic cores for a programmable logic device having programmable interconnect resources, comprising:

means for defining at least one run-time parameterizable logic core in a run-time reconfiguration program, the logic core having a set of output pins and a set of input pins;

means for automatically selecting a subset of programmable interconnect resources to make the required connections and automatically generating pre-routed program code to program the subset of programmable interconnect resources in response to input data specifying required connections from the output pins to the input pins;

means for parameterizing the pre-routed program code; and means for including the parameterized program code in the run-time reconfiguration program.

* * * * *